(12) United States Patent
Voldman et al.

(10) Patent No.: US 7,173,310 B2
(45) Date of Patent: Feb. 6, 2007

(54) LATERAL LUBISTOR STRUCTURE AND METHOD

(75) Inventors: Steven H. Voldman, South Burlington, VT (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,961

(22) Filed: Jun. 2, 2005

(65) Prior Publication Data

US 2006/0273372 A1    Dec. 7, 2006

Related U.S. Application Data

(63) Continuation of application No. PCT/US02/38546, filed on Dec. 3, 2002.

(51) Int. Cl.
  H01L 27/01    (2006.01)
  H01L 27/12    (2006.01)
  H01L 29/00    (2006.01)
  H01L 31/0392    (2006.01)

(52) U.S. Cl. .................. 257/350; 257/347; 257/401; 257/449; 257/536

(58) Field of Classification Search ............... 257/347, 257/350, 401, 449, 536
See application file for complete search history.

(56) References Cited

U.S. PATENT DOCUMENTS

| | | | |
|---|---|---|---|
| 4,037,140 A | 7/1977 | Eaton, Jr. | |
| 4,282,556 A | 8/1981 | Ipri | |
| 5,287,377 A * | 2/1994 | Fukuzawa et al. | 372/45.01 |
| 5,610,790 A | 3/1997 | Staab et al. | |
| 5,616,944 A | 4/1997 | Mizutani et al. | |
| 6,404,269 B1 * | 6/2002 | Voldman | 327/534 |
| 6,413,802 B1 | 7/2002 | Hu et al. | |
| 6,894,324 B2 * | 5/2005 | Ker et al. | 257/199 |
| 6,967,363 B1 * | 11/2005 | Buller | 257/288 |
| 7,064,413 B2 * | 6/2006 | Fried et al. | 257/536 |
| 2002/0109253 A1 | 8/2002 | Sanyal | |
| 2004/0105203 A1 * | 6/2004 | Ker et al. | 361/56 |
| 2004/0159910 A1 * | 8/2004 | Fried et al. | 257/536 |
| 2004/0188705 A1 * | 9/2004 | Yeo et al. | 257/170 |
| 2005/0035410 A1 * | 2/2005 | Yeo et al. | 257/355 |
| 2005/0035415 A1 * | 2/2005 | Yeo et al. | 257/401 |

* cited by examiner

Primary Examiner—Kenneth Parker
Assistant Examiner—Jesse A. Fenty
(74) Attorney, Agent, or Firm—Joseph P. Abate

(57) ABSTRACT

An ESD LUBISTOR structure based on FINFET technology employs a vertical fin (a thin vertical member containing the source, drain and body of the device) in alternatives with and without a gate. The gate may be connected to the external electrode being protected to make a self-activating device or may be connected to a reference voltage. The device may be used in digital or analog circuits.

14 Claims, 10 Drawing Sheets

US 7,173,310 B2

LATERAL LUBISTOR STRUCTURE AND METHOD

This application is a continuation of PCT application #PCT/US2002/038546 filed 3 Dec. 2002.

TECHNICAL FIELD

The present invention generally relates to the field of integrated circuit fabrication, in particular of fabricating devices for electrostatic discharge protection (ESD) in integrated circuit technologies that use FINFETs.

BACKGROUND ART

The FINFET is a promising integrated circuit technology that employs a thin (10 nm–100 nm) vertical member as the source, drain and body of a field effect transistor (FET) and has a gate that is next to two vertical sides and the top of the channel. With such a thin body, there is very strong gate coupling, so that fully depleted operation is readily achieved. These structures will require overvoltage protection from electrical overstress (EOS), such as electrostatic discharge (ESD), as well as other voltage or current related stress events that are present in the semiconductor manufacturing, shipping and test processes. EOS events include over-current stress, latchup, and high current that occurs during testing and stressing. ESD events such as those occurring in the course of the human body model (HBM), machine model (MM), charged device model (CDM), transient latchup (TLU), cable discharge model, cassette model (CM) as well as other events can lead to electrical failure of FINFET structures.

Hence, it is evident that EOS and ESD protection of FINFET structures are necessary to provide adequate ESD protection for these structures.

U.S. Pat. No. 6,015,993 illustrates construction techniques for lateral ESD devices having a gated diode, where the channel is formed in bulk silicon or in the device layer of an SOI wafer. This structure is not compatible with FINFET structures and FINFET processing.

DISCLOSURE OF THE INVENTION

The invention relates to structures that provide EOS and ESD protection to FINFET technology.

According to an aspect of the invention, an ESD LUBISTOR structure based on FINFET technology employs a vertical fin (a thin vertical member containing the source, drain and body of the device) in alternative embodiments with and without a gate. The gate may be connected to the external electrode being protected to make a self-activating device or may be connected to a reference voltage. The device may be used in digital or analog circuits.

Accordingly, a structure is provided in an integrated circuit based on a substrate, which includes an elongated vertical member including a semiconductor, projecting from the substrate and having a top and two opposite elongated sides. A first electrode is formed in a first end of the vertical member and a second electrode, of opposite polarity, is formed in a second, opposite, end of the vertical member. The first and second electrodes are doped with an electrode concentration greater than a dopant concentration in a central portion of the vertical member, between the first and second electrodes.

BEST MODE FOR CARRYING OUT THE INVENTION

Figure 1A:
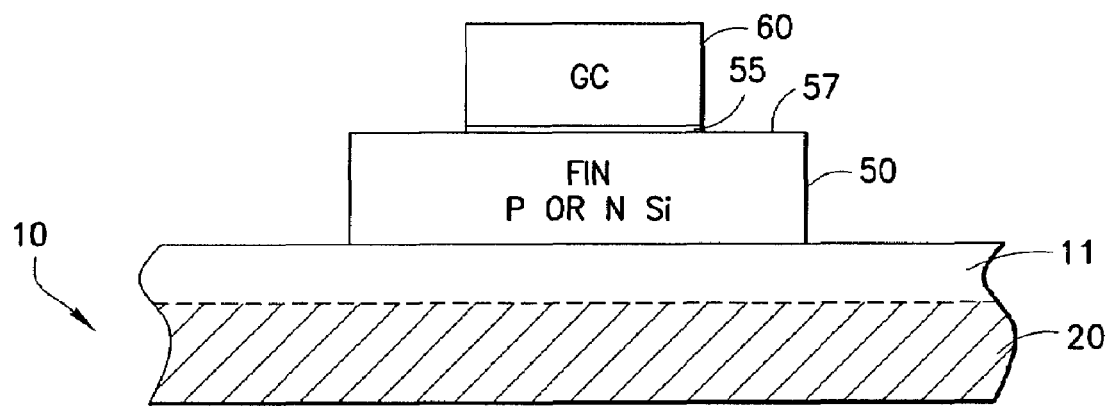
FIGS. 1A and 1B show plan and cross sections of a device according to the invention in an early stage.

An ESD LUBISTOR structure based on FINFET technology employs a vertical fin (a thin vertical member containing the source, drain and body of the device) in alternatives with and without a gate. The gate may be connected to the external electrode being protected to make a self-activating device or may be connected to a reference voltage. The device may be used in digital or analog circuits.

Among the benefits which may possibly arise from one or more preferred embodiments of the invention are the following:

provision of ESD-robust structures which are compatible with FINFET semiconductor processing and structures;

use of ESD-robust FINFET structures and supporting structures;

provision of a fin having diode terminals separated by a body, controlled by a gate or ungated with a doping structure such as $p^+/p^-/n^+$, $p^+/n^-/n^+$, or $p^+/p^-/n^-/n^+$;

provision of a lateral gated diode formed on a layer of insulator and having a $p^+/p^-/n^+$ structure or $p^+/n^-/n^+$, or $p^+/p^-/n^-/n^+$ with a body contact to the lightly doped body;

provision of a FINFET structure having a body contact that allows for a dynamic threshold FINFET device for use as an ESD protection element; and provision of a FINFET resistor element (gated or ungated) to provide electrical and thermal stability of a FINFET device for ESD protection.

Referring now to the drawings, and more particularly to FIG. 1, a process sequence according to the invention involves preliminary steps of forming the fin or vertical member (for the FIN-Diode structure) that are conventional in FINFET technology. Typically, a hard mask of appropriate width (less than 10 nm) is formed, e.g. by forming a nitride sidewall on a dummy oxide mesa that has been formed on a (single crystal or epitaxial film) silicon layer. The silicon film may be single crystal silicon (including an epitaxial layer). Polysilicon, selective silicon, strained silicon on a silicon germanium film, or other films may also be used. The silicon is etched in a directional dry etch that leaves a thin vertical member, illustratively 10 nm thick, 1 um wide and 0.1 um long that will provide the electrodes and the body of the device.

Figure 1B:
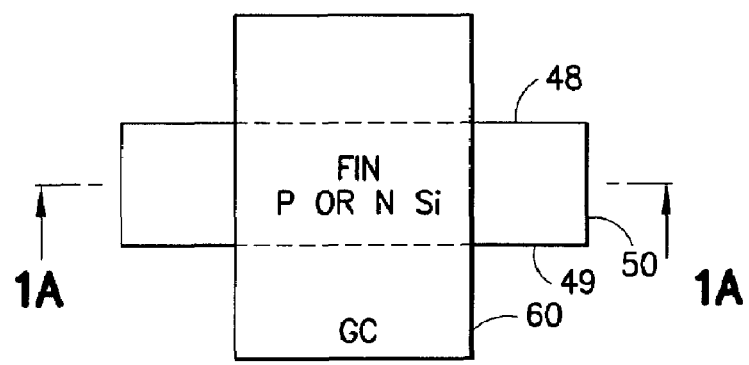

Referring to FIGS. 1A and 1B, the top view in FIG. 1B shows a gate 60 above the fin 50, the gate extending in front of and behind the plane of the cross section of FIG. 1A. In FIG. 1A, substrate 10 has fin 50 disposed on it, separated by gate dielectric 55, illustratively 1 nm of oxide, from gate 60. In this example, fin 50 rests directly on the silicon substrate, but some versions of the invention may have a dielectric layer between the substrate and the fin, e.g. the buried insulator in a silicon on insulator (SOI) wafer. In this example, the substrate is an SOI substrate and buried oxide 20 is shown as below device layer 10. In some versions, the fin may be formed from the device layer and rest on the buried oxide. Illustratively, fin 50 is initially doped p⁻, as is layer 10. Gate 60 is polysilicon (poly), doped later by implantation.

Figure 2:
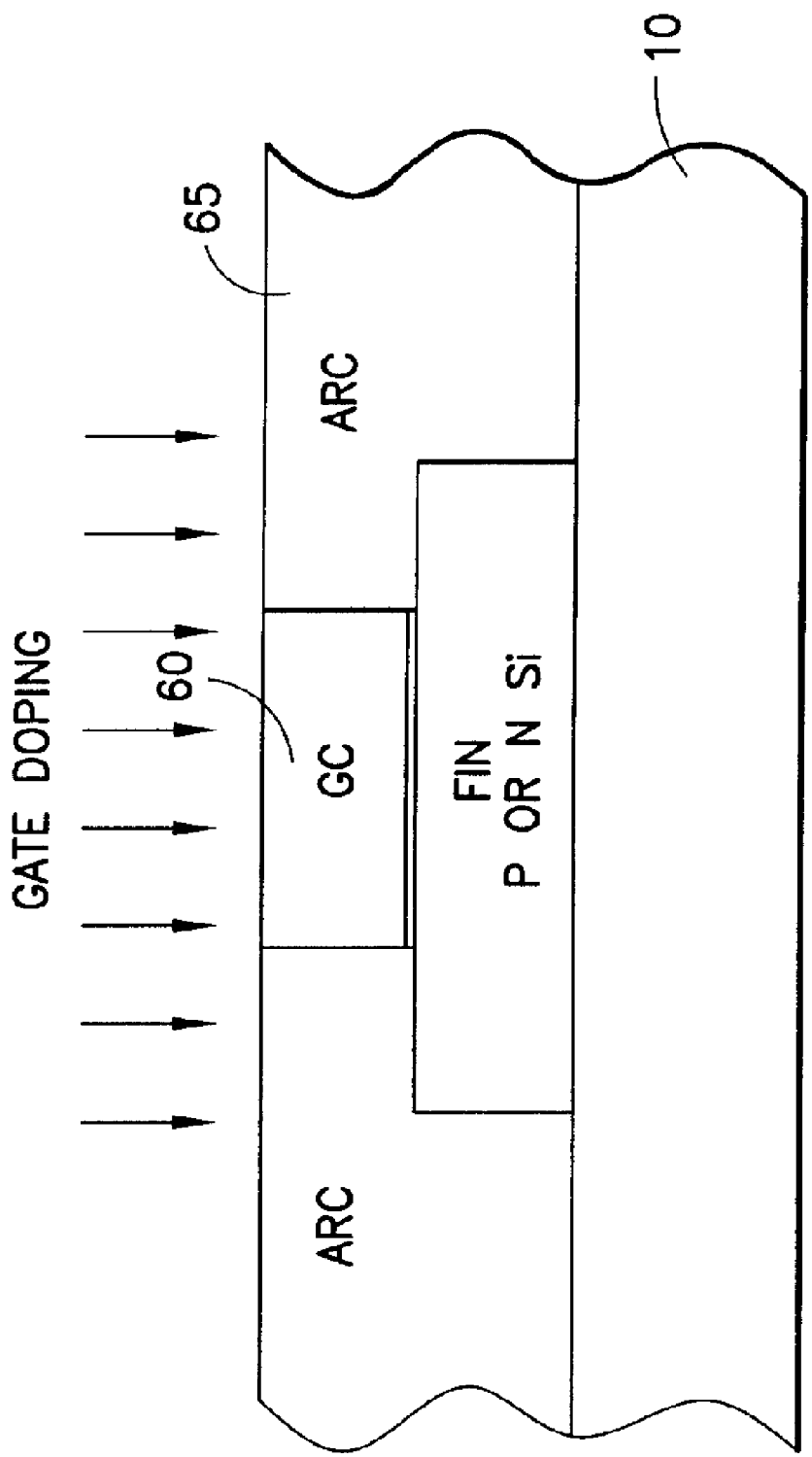
FIGS. 2–4 show cross sections of the same device at further stages.

The gate implantation step is shown in FIG. 2, with temporary layer 65, illustratively an anti-reflection coating that has been deposited as a step in forming other devices in the circuit and has been planarized, e.g. by chemical-mechanical polishing to the level of gate 60. Gate 60 is implanted with a heavy dose of ions, either p or n. Preferably, gate 60 receives an $N^{++}$ dose of about $10^{21}/cm^2$, e.g. two order of magnitude greater than an $N^+$ dose of $5 \times 10^{19}/cm^2$. With this degree of difference, any further doping that the gate receives will not significantly affect its work function.

Figure 3A:
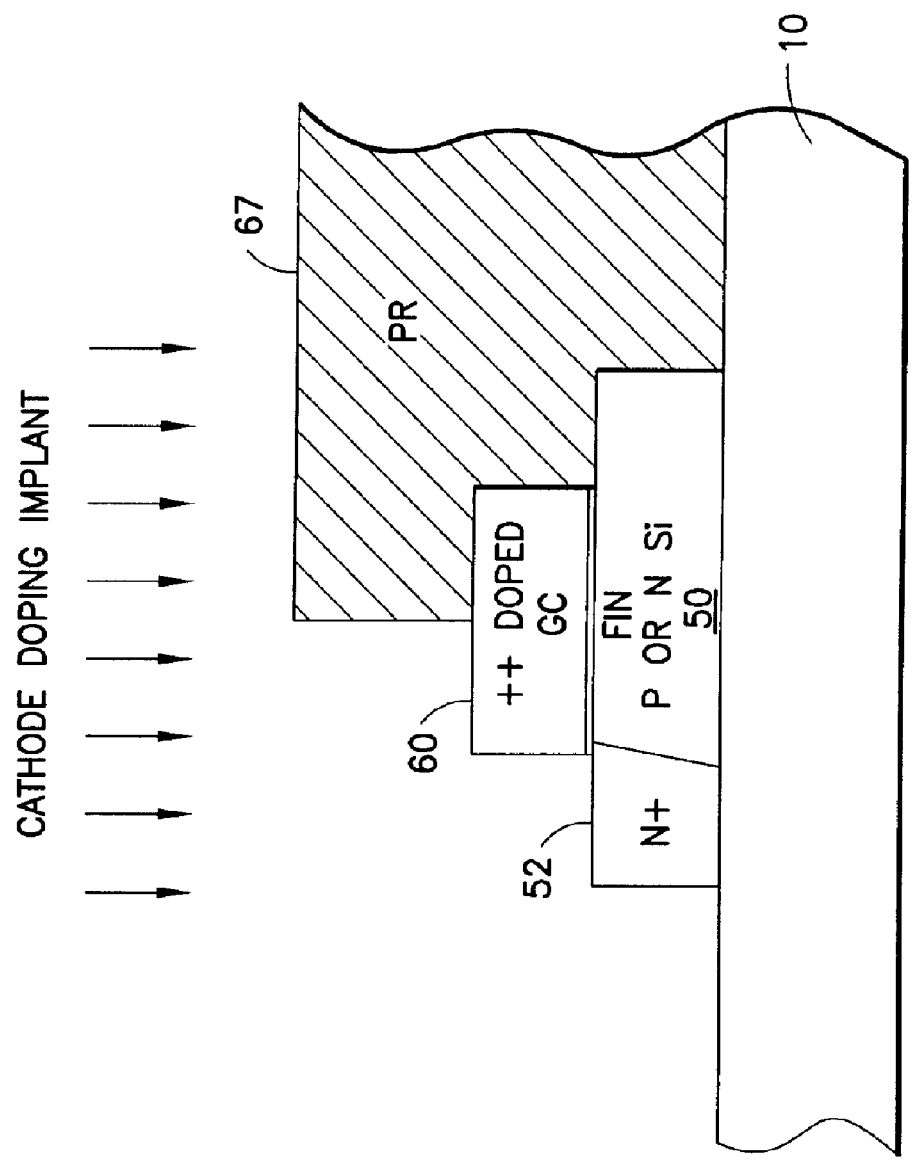
Figure 3B:
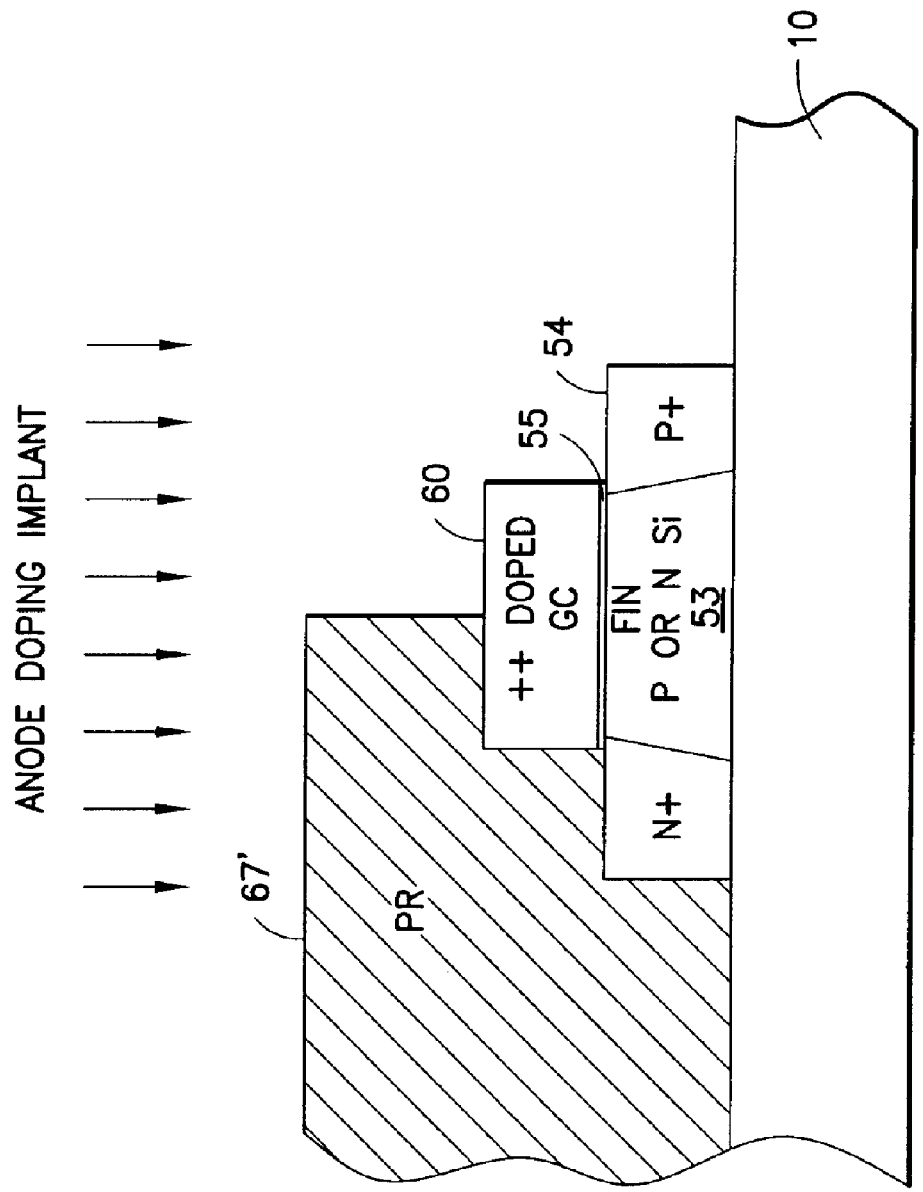

In FIGS. 3A and 3B, a non-critical aperture has been opened to expose the cathode 52, which is implanted $N^+$ (with a dose at least one order of magnitude less than the gate implant). Optionally, an aperture can be opened in the ARC or any other convenient mask such as a layer of photoresist 67 can be put down and patterned. FIG. 3B shows the same process, with anode 54 being implanted. Again, the dose ($P^+$) is one tenth that of the gate.

The fin has been implanted at an earlier stage. It can be implanted when it is put down if it is polysilicon and a single polarity is required. Optionally, the fin can be formed before the well implants and apertures can be opened in the photoresist for the well implants so that the fin receives P and/or N implants simultaneously with the wells.

Figure 4:
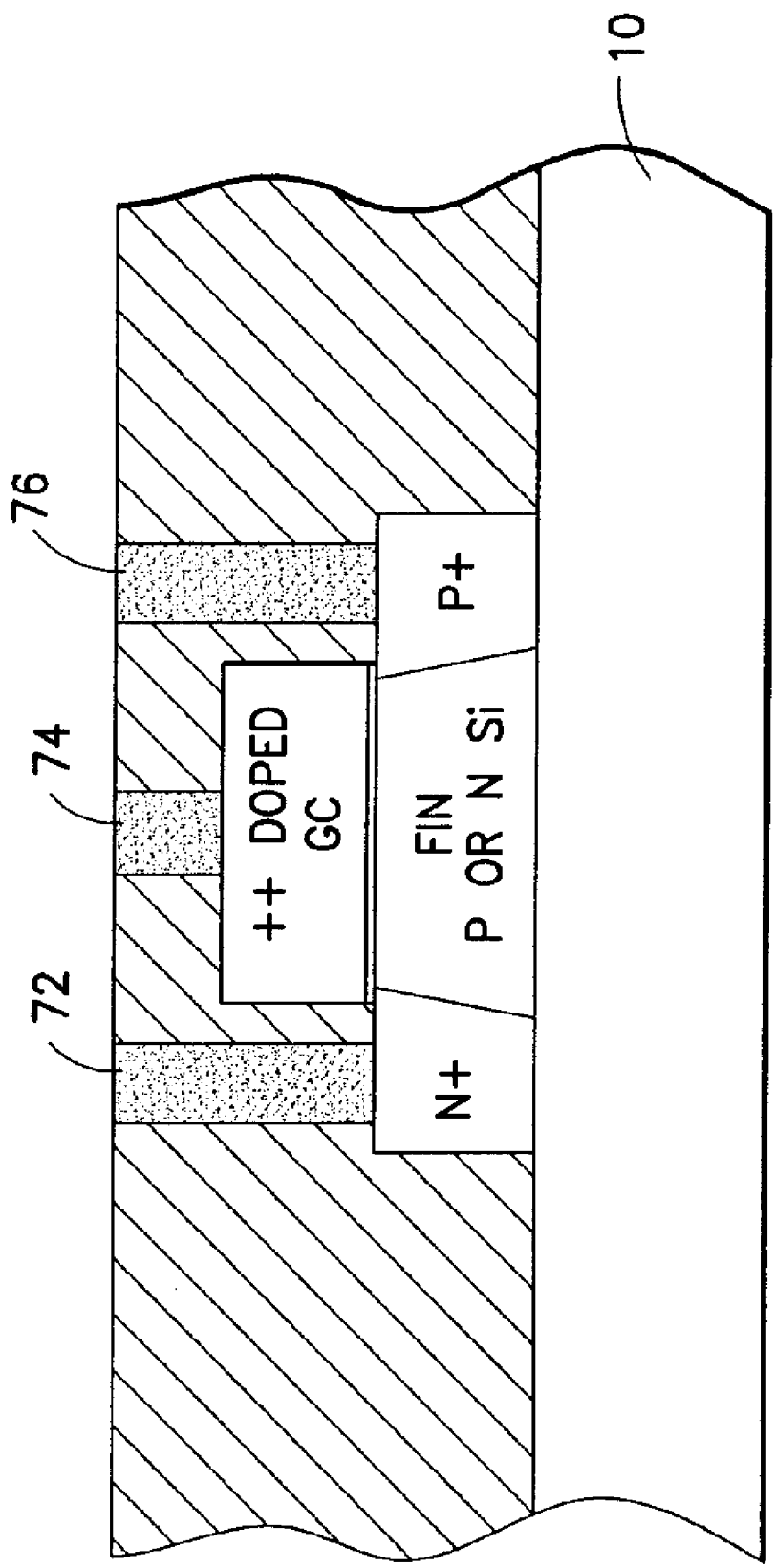

Referring now to FIG. 4, there is shown the FIN-Diode device after deposition of the final interlayer dielectric, formation of apertures for contacts 72, 74 and 76 and deposition of the contact material. Since these contacts are at a low level, it is appropriate to use tungsten (W), if that is being used for other contacts at this level. If poly is being used at this level, then poly contacts are adequate. For electrical interconnects, standard interconnects (Al or Cu) and inter-level dielectrics (ILD) processes can be used. Aluminum interconnect structures can consist of an adhesive refractory metal (eg. TiN), a refractory metal (eg. Ti, TiNi, Co), and an aluminum structure for adhesion, diffusion barriers and to provide good electrical conductivity. Copper interconnect structures can consist of an adhesive film (e.g. TaN), refractory metal (e.g. Ta) and a copper interconnect. Typically, for Cu interconnect structures, the structures are formed using a single damascene or dual damascene process. For ESD and resistor ballasting in these structures, refractory metals can be used because of their high melting temperatures.

The advantage of the gate in this FIN-Diode structure shown in FIG. 4 is that the current in the gated p+/n−/n+ structure can be modulated by electrical control of the gate structure. Hence, the leakage, bias, and electrical stress can be modulated by connection of the gate structure to an anode or cathode node, a ground plane or power supply, a voltage or current reference circuit, or an electrical network. A disadvantage of the gate is that the gate insulator may be damaged. The circuit designer will make a choice based on trading off advantages and drawbacks.

A set of several FIN-Diode structures can be placed in parallel to provide a lower total series resistance, and higher total current carrying capability, and a higher power-to-failure of the ESD structure. For example, the anode and cathode connections can all be such as to allow electrical connections of the parallel FINFET diode structures. These parallel structures may or may not use the same gate electrode. There can also be personalization and customization of the number of parallel elements based on the ESD requirement or performance objectives. Additionally, there can be resistor ballasting, and different gate biases can be established to allow improved current uniformity, or providing a means to turn-on or turn-off the elements. The advantage of the parallel elements compared to a prior art device is: 1) three-dimensional capability, 2) improved current ballasting control, and 3) improved current uniformity control. In two-dimensional single finger Lubistor structures, current uniformity is not inherent in the design, causing a weakening of the ESD robustness per unit micron of cross sectional area. In these structures, the thermal heating of each FIN-Diode structure is isolated from adjacent regions. This prevents thermal coupling between adjacent regions from providing a uniform thermal profile and ESD robustness uniformity in each FIN-Diode parallel element.

Additionally, these FIN-Diode structures can be designed as p+/p−/n+ elements or p+/n−/n+ elements. The difference in the location of the metallurgical junction makes one implementation superior to the other for different purposes. This has been shown experimentally by the inventor and is a function of the doping concentration and application. The choice will be affected by the capacitance-resistance tradeoff and by the possibility of using an implant for the FIN-Diode that is originally intended for some other application. When a lower resistance is better suited for the purpose at hand, and the available implant has a relatively low dose, a $p^+/n^-/n^+$ structure is preferred because of the higher mobility of electrons. Conversely, when the dose of the available implant is relatively high, a $p^+/p^-/n^+$ structure would be preferred.

Halo implants can be established in these devices to allow improved lateral conduction, better junction capacitance, and improved breakdown characteristics. In this case, a halo is preferably provided for only one doping polarity to prevent a parasitic diode formed by the wrong halo implant in the wrong polarity.

Figure 5:
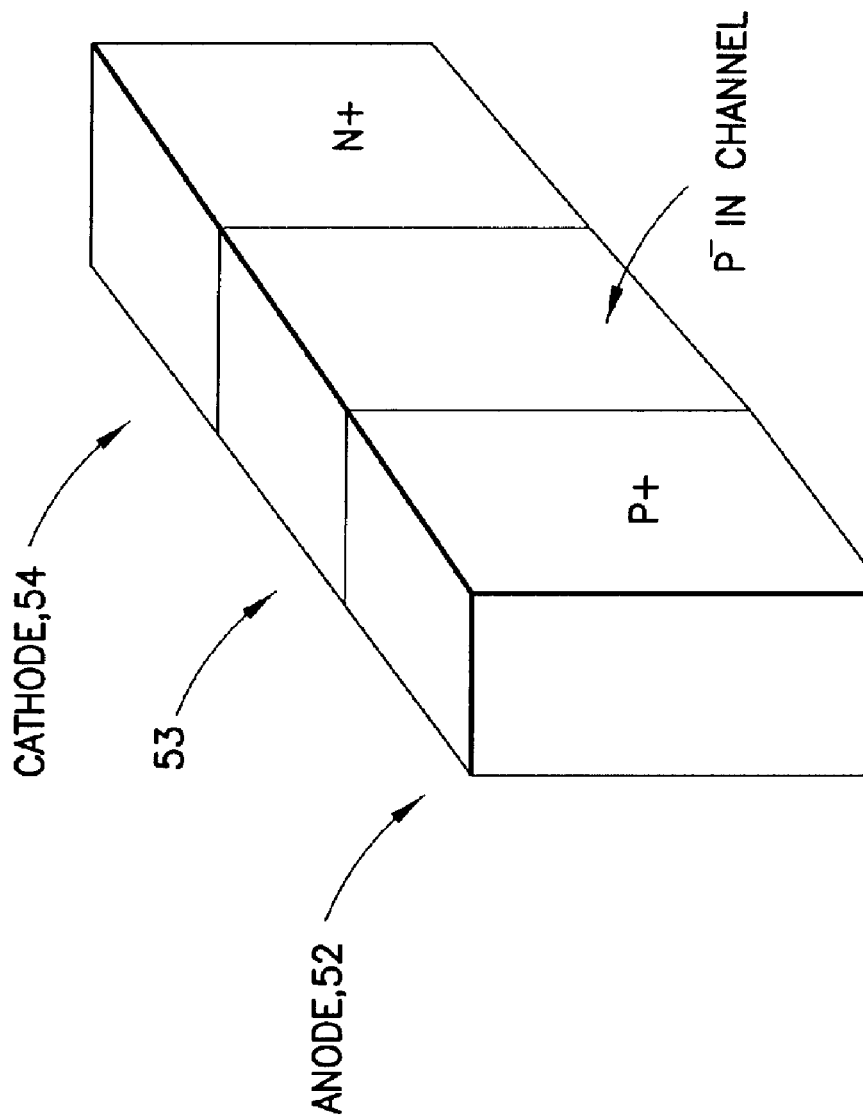
FIGS. 5 and 6 show examples of alternative embodiments.

FIG. 5 illustrates an alternative version of the FIN-Diode structure in which the channel is doped $P^-$ and there is no separate gate. Its advantage is that the gate is not exposed to the ESD voltage stress. Electrical overstress in the gate dielectric can be eliminated by not allowing the gate structure to be present.

CDM failure mechanisms can occur due to the electrical connection of the gate structure for FINFET ESD protection networks. Whereas the prior embodiment containing a gate allowed for electrical control, that embodiment also required more electrical connections and/or design area for electrical circuitry. In the case of this embodiment, less electrical connections are necessary, allowing for a denser circuit.

In the embodiment of FIG. 5, a plurality of parallel FIN-Diode structures can be placed closely to allow for a high ESD robustness per unit area. Additionally, resistor ballasting and current uniformity control can be addressed by varying the effective resistance in the individual FIN-Diode structures. With the physical isolation of the adjacent FIN-Diode structures, the thermal coupling between adjacent elements can be reduced. Optimization of the spacing between adjacent elements can be insured by proper spacing and non-uniform adjacent spacing conditions to provide the optimum thermal result. This provides a thermal methodology allowing for optimization of the elements. This thermal methodology can not be utilized in the two-dimensional Lubistor element but is a natural methodology in construction of parallel FIN-Diode structures.

Figure 6:
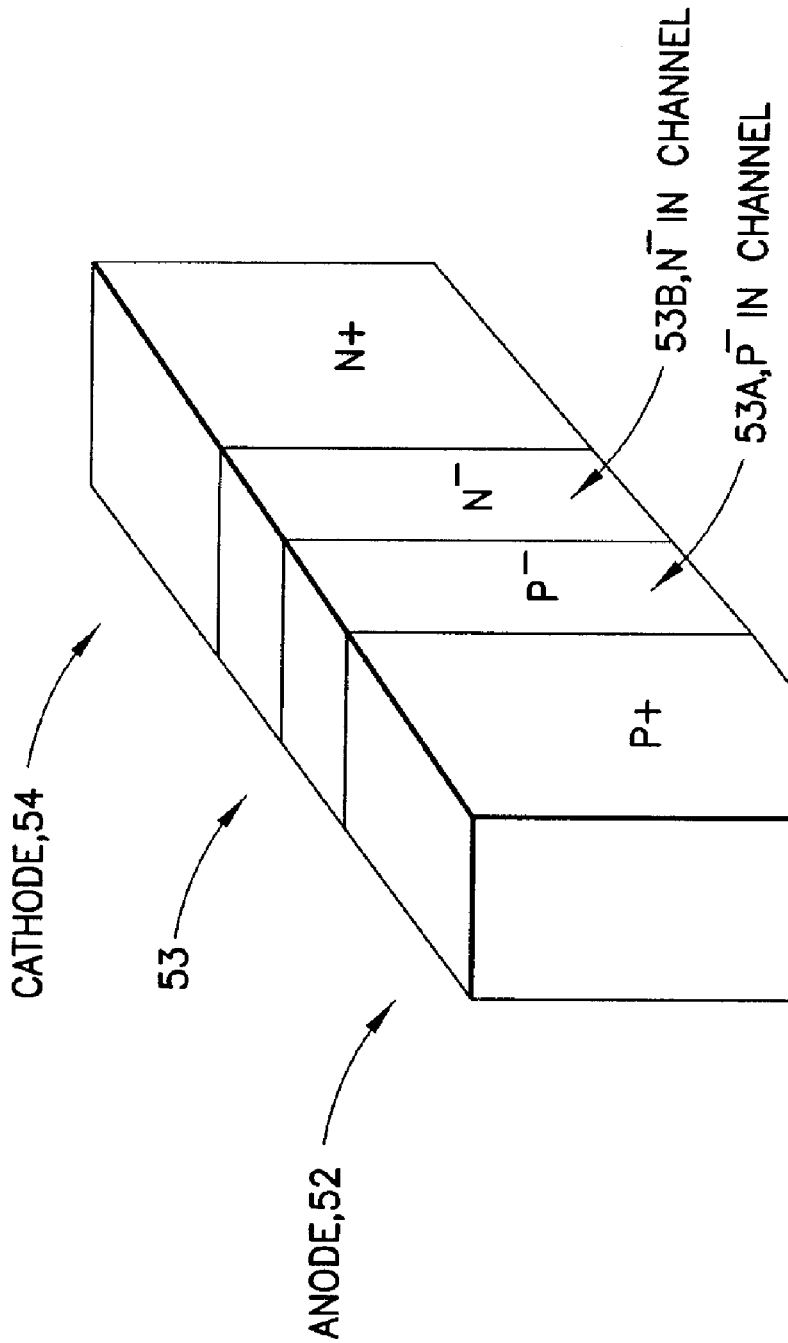

Similarly, FIG. 6 illustrates a version in which the body is divided into two doped areas; a first P⁻ and a second N⁻ body region. This FIN-Diode structure allows for the optimization and placement of the metallurgical junction independent of the gate structure. This implant can be the p-well and/or n-well implant, or provided by halo type implantation (e.g. Angled, twist or straight), or other known implantation or diffusion process steps. The gradual profile introduced by the p+/p− transition, and the n+/n− transition provide a less abrupt junction and can lead to an improved ESD robustness.

The version of the devices that have a gate may be divided into several categories:

1) An N⁺/P FIN-Gated diode with the body contacting the substrate 10. In this case, there is a path to the substrate.
2) An N⁺/P FIN-Gated diode with a floating body on SOI.
3) An N⁺/P FIN-Gated diode on SOI with the gate contacting the (P⁺) body permits dynamic control of the anode potential.
4) An N⁺/P FIN-Gated diode on SOI with the gate contacting the N⁺ cathode.

To provide ESD protection to a FINFET device it is also advantageous to provide resistor elements integrated and/or unintegrated into FINFET devices.

Figure 8:
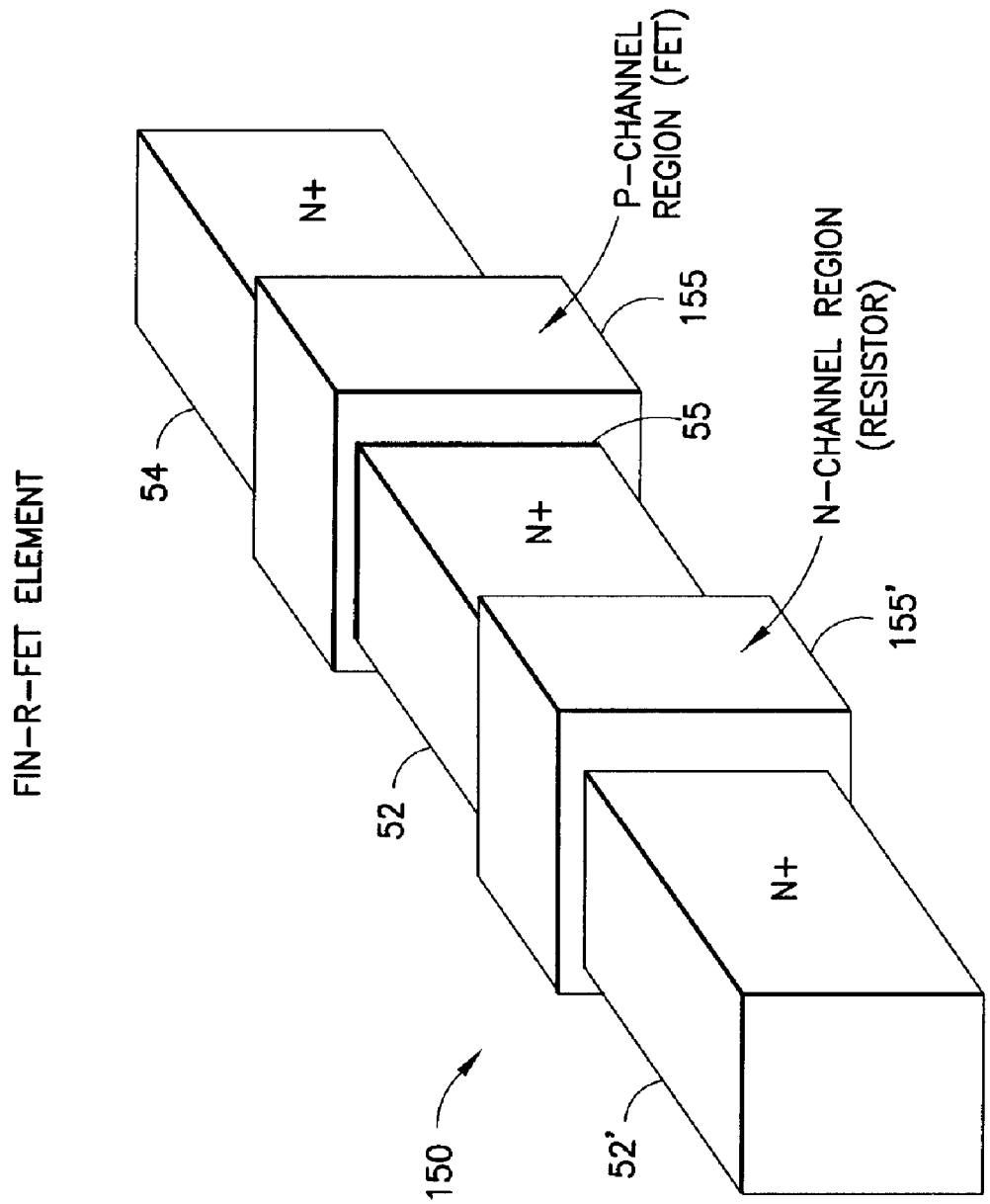
FIG. 8 shows a view of a Fin-resistor integrated with a FINFET.

Referring to FIG. 8, a FINFET device can be formed by similar techniques used in previous embodiments and having a source and drain implant of the same polarity separated by a body of opposite polarity. The body is covered by a gate insulator 55 and gate 155. This structure can be formed by a symmetric or asymmetric implant to provide ESD advantage. Additionally, to provide ESD robust FINFET structures, a resistor can be combined in the same structure. Illustratively, a second gate 155' can be placed in series with the drain structure where the second gate structure provides blockage of the heavily doped source/drain implant so that the lightly doped fin provides resistance. The gate structure serves two purposes: first, it provides a resistive region in the source or drain region; second it provides a means to block the salicide film placed on the source or drain region from shorting the resistor. This forms a _ballasting resistor_ inherently integrated with the FINFET. We will refer to this structure as the FIN-R-FET structure.

Additionally, this second gate structure 155' can be removed from the FIN-R-FET, as was done in the FIN-Diode structure. The removal of the second gate structure after salicidation allows for the prevention of electrical overstress or ESD issues with the resistor element.

This 150 element used in the FIN-R-FET device can also be constructed as a stand-alone resistor element. This is achieved by placing a n-channel FINFET into a n-well or n-body region. This resistor, or FIN-R device, can be used to provide ESD robustness for FINFETs, FIN-Diodes or used in circuit applications. As previously discussed, the gate can be removed to avoid electrical overstress in the physical element.

Additionally, to improve the ESD robustness of the FINFET device, the salicide can be removed from the source, drain and gate regions. Since the gate length of the device is relatively small compared to planar devices, the salicide can be removed in the gate regions.

Figure 7:
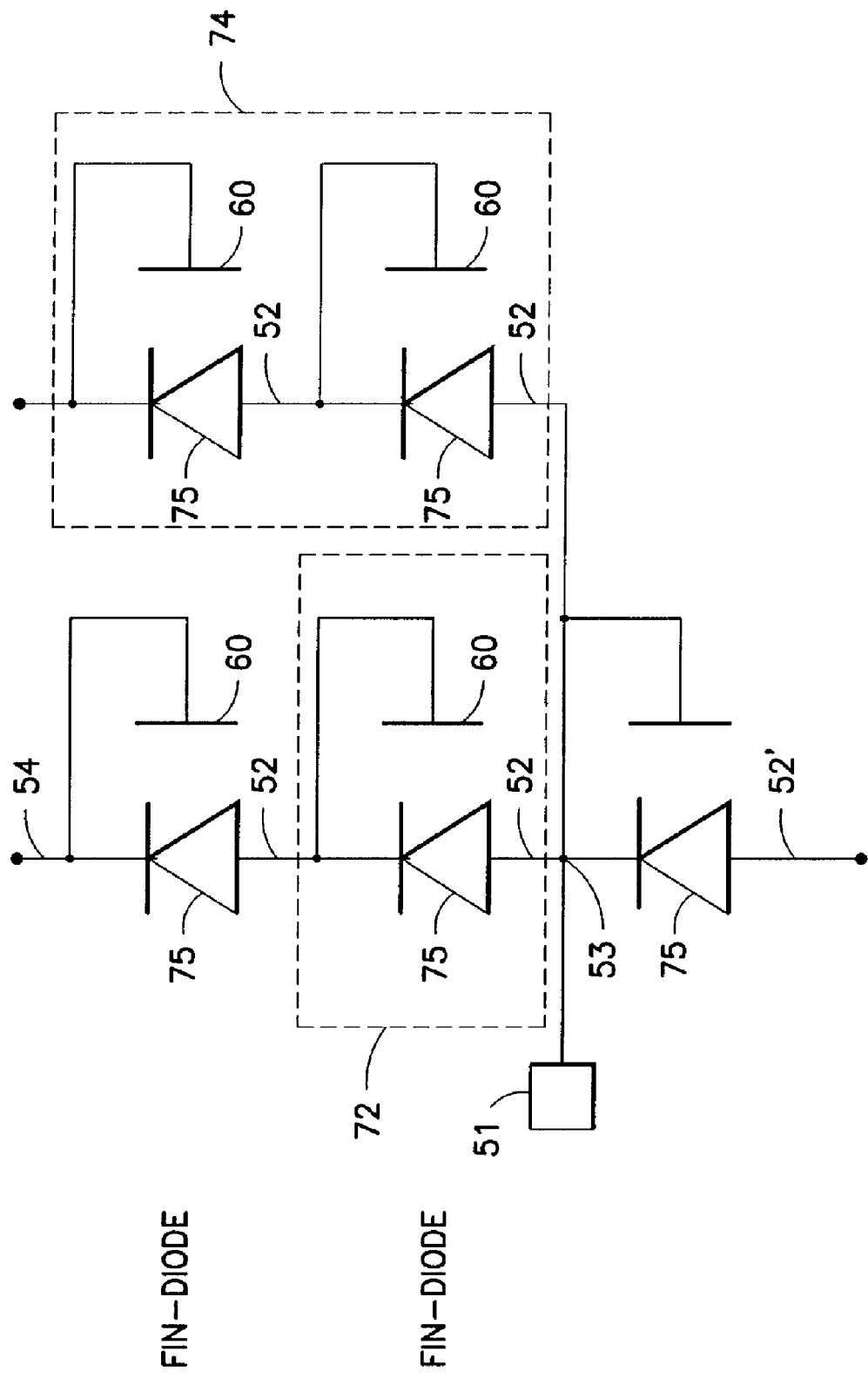
FIG. 7 shows a schematic representation of the device in an ESD application.

Referring now to FIG. 7, there is shown a schematic of a typical arrangement for protecting a circuit from ESD on terminal 51. The dotted lines denoted with numerals 72 and 74 indicate options discussed below. Two FIN-LUBISTORs according to the invention are connected between the protected node 53 and the voltage terminals at 54 and 52'. In this case, gates 60 are connected to terminal 54, so that an ESD event dynamically reduces the resistance of one of the diodes. Alternatively, the terminals 60 could be connected to power supplies. To avoid electrical overstress to the gate structures, electrical circuits comprising of FINFET devices can be used to electrically isolate the gate structures from the electrical overstress. Electrical circuits with FINFET-based inverters, or FINFET-based reference control networks to provide electrical isolation from the power supplies, prevent overstress and establish a potential to avoid leakage.

To utilize as an ESD network for human body model (HBM), machine model (MM), and other ESD events, a plurality of lateral FIN-Diode structures must be used in parallel to minimize series resistance and to be able to discharge a large current through the structure without failure occurring in the FIN-Diode element or the circuitry. Hence a plurality of parallel FIN-Diode elements is placed connected between the input pin and the power supplies.

For voltage tolerance, an ESD network is shown in FIG. 7 constructed of FIN-Diode elements in a series configuration, now including the FIN-Diode 75 within dotted line 72. FIN-Diode structures can be constructed where the first FIN-Diode element anode is connected to a first pad, and the cathode is connected to a second FIN-Diode anode. This can continue in a string or series configuration. For each stage in series, a plurality of parallel FIN-Diode elements can be placed for each _stage_ of the string of FIN-Diodes. These strings can be placed between input pad and a power-supply, between two common power supply pads (e.g. VDD1 and VDD1), any two dissimilar power supply pads (e.g. VCC and VDD), any ground rails (e.g. VSS1 and VSS2), and any dissimilar ground rails (e.g. VSS and VEE). These FIN-Diode series elements can be configured as a single series string or back-to-back configuration to allow for bidirectional current flow between the two pads. For input pads to power supplies, typically, only a single FIN-Diode string will exist to provide uni-directional current flow.

Figure 9:
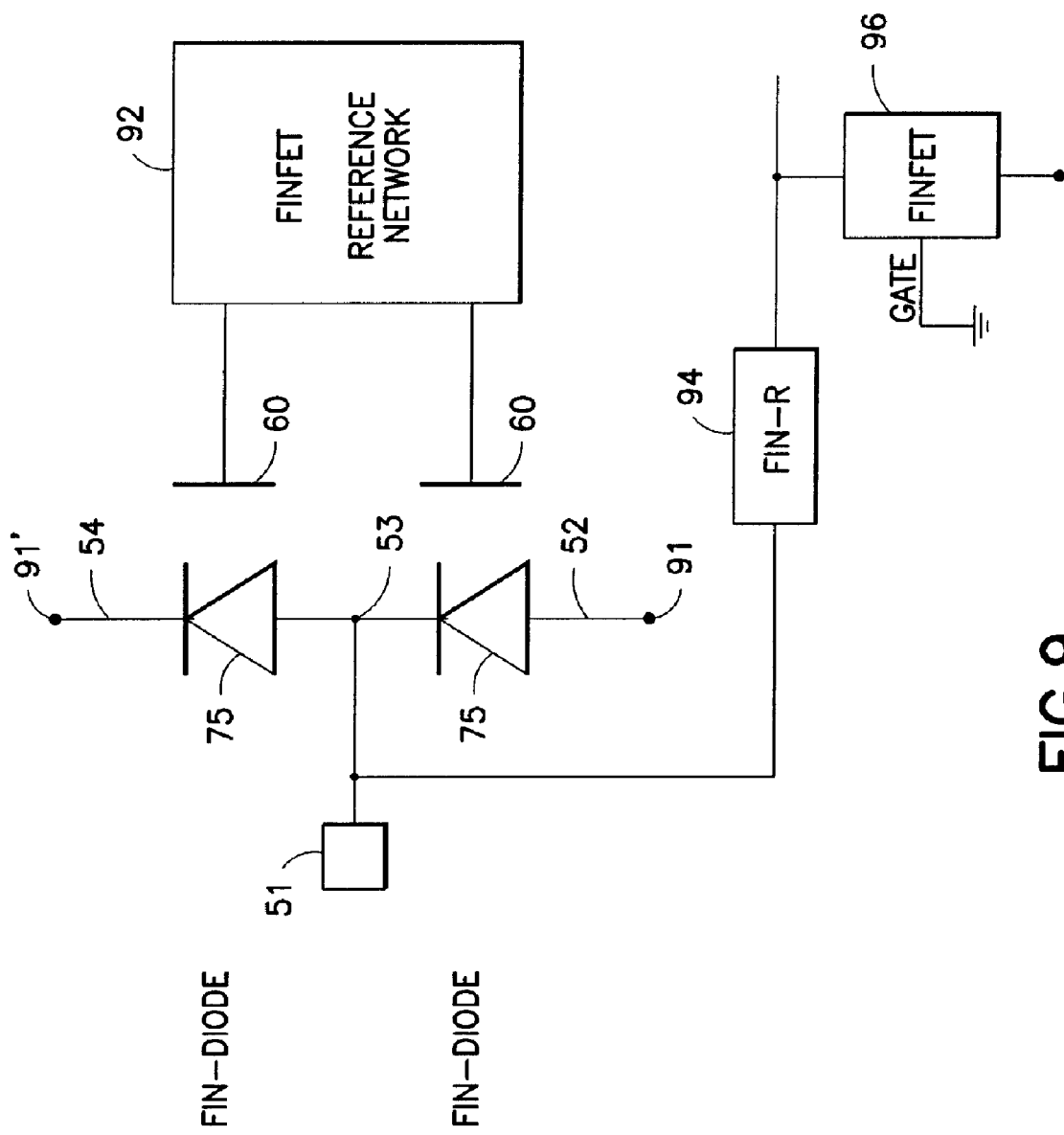
FIG. 9 shows another ESD application.

For HBM and charged device model (CDM) events, an ESD circuit consisting of a FIN-Diode element, a FIN-resistor (FIN-R) element, and a FINFET may be used to improve ESD results. FIG. 9 is an example of a circuit to provide ESD protection utilizing a FIN-Diode element 75, a FIN-resistor 94 and a FINFET 96 with its gate connected to ground. Illustratively, the gate voltage of the FIN-Diodes is provided by a reference network, not by the ESD voltage itself. This permits better control of the current capacity of the diodes 75.

Additionally, ESD protection can be provided utilizing a resistor ballasted FIN-R-FET element. This circuit can be implemented in two fashions. First, utilizing a FIN-R resistor in series with a FINFET. To provide ESD protection a plurality of parallel FIN-R resistors are placed in series with a plurality of FINFET devices. Another implementation can use a plurality of parallel FIN-R-FET structures for ESD protection. These aforementioned structures can be placed in a cascode configuration for higher snapback voltage or voltage tolerance. For ESD protection, as in the case of FIN-Diode elements, a series of stages of FINFETs with FIN-R resistor elements can be connected where each stage includes a parallel set of elements.

Devices constructed according to the invention are not restricted to ESD uses and may also be employed in a conventional role in circuits—digital, analog, and radio frequency (RF) circuits. The invention is not restricted to silicon wafers and other wafers, such as SiGe alloy or GaAs may be used. These structures can be placed on a strained silicon film, utilizing SiGe deposited or grown films. These structures are suitable for silicon on insulator (SOI), RF SOI, and ultra-thin SOI (UTSOI).

While the invention has been described in terms of a single preferred embodiment, those skilled in the art will recognize that the invention can be practiced in various versions within the spirit and scope of the following claims.

INDUSTRIAL APPLICABILITY

The invention has applicability to integrated circuit electronic devices and their fabrication.

The invention claimed is:

1. A structure in an integrated circuit, comprising:
   an elongated vertical fin member having a thickness in a range of 10 nm to 100 nm and comprising a semiconductor, said elongated vertical fin member projecting from a bulk semiconductor substrate and having a top and two opposite elongated sides, in which
   a first electrode is formed in a first end of said elongated vertical fin member and
   a second electrode, of opposite polarity to said first electrode, is formed in a second end of said elongated vertical fin member opposite said first end,
   said first and said second electrodes being doped with an electrode concentration greater than a dopant concentration in a central portion between said first and second electrodes.

2. A structure according to claim 1, in which one of said electrodes is doped $p^+$ and the other of said electrodes is doped $n^+$.

3. A structure according to claim 1, in which one of said electrodes is doped $p^+$, said central portion is doped $p^-$ and the other of said electrodes is doped $n^+$.

4. A structure according to claim 2, in which a first sub-portion of said central portion adjacent to a first electrode is doped with the same polarity as said first electrode and with a lower concentration and a second sub-portion of said central portion adjacent to said second electrode is doped with the same polarity as said second electrode and with a lower concentration.

5. A structure according to claim 2, in which said dopants are arranged in a sequence $p^+/p^-/n^-/n^+$.

6. A structure according to claim 1, further comprising:
   a gate disposed over a central portion of said top and in proximity to central portions of said two sides, said gate being separated from said vertical member by a dielectric gate layer.

7. An electrostatic discharge (ESD) protection circuit being attached to an external terminal of an integrated circuit and including a structure according to claim 1.

8. An ESD protection circuit according to claim 7, further comprising two devices, in which said external terminal is connected to an anode of a first device and to a cathode of the other device.

9. An ESD protection circuit according to claim 7, in which said substrate is an SOI substrate having a layer of buried insulator and said vertical fin member is disposed directly on said buried insulator layer.

10. An ESD protection circuit according to claim 7, in which said substrate is a bulk substrate and said vertical member is disposed directly on said bulk substrate.

11. An ESD protection circuit according to claim 7 comprising a plurality of FIN-Diode structures connected in parallel between an external terminal and a voltage terminal.

12. An ESD protection circuit according to claim 7 comprising at least one FIN-Diode structure in a series configuration between two external terminals.

13. An ESD protection circuit according to claim 7 comprising at least one FIN-Diode structure, and at least one FIN-R resistor element.

14. An ESD protection circuit according to claim 7 comprising at least one FIN-Diode structure, at least one FIN-R resistor element, and at least one FINFET element.

* * * * *